(12) United States Patent
Ho et al.

(10) Patent No.: US 11,393,763 B2
(45) Date of Patent: Jul. 19, 2022

(54) INTEGRATED FAN-OUT (INFO) PACKAGE STRUCTURE AND METHOD

(71) Applicant: Taiwan Semiconductor Manufacturing Co., Ltd., Hsinchu (TW)

(72) Inventors: Ming-Che Ho, Tainan (TW); Hung-Jui Kuo, Hsinchu (TW); Tzung-Hui Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/885,291

(22) Filed: May 28, 2020

(65) Prior Publication Data

US 2021/0375767 A1 Dec. 2, 2021

(51) Int. Cl.
*H01L 23/538* (2006.01)
*H01L 25/065* (2006.01)
*H01L 25/00* (2006.01)
*H01L 23/31* (2006.01)
*H01L 23/00* (2006.01)

(52) U.S. Cl.
CPC .......... *H01L 23/5384* (2013.01); *H01L 23/31* (2013.01); *H01L 23/5386* (2013.01); *H01L 24/26* (2013.01); *H01L 25/0657* (2013.01); *H01L 25/50* (2013.01)

(58) Field of Classification Search
CPC ...... H01L 23/5384; H01L 23/31; H01L 24/26
See application file for complete search history.

(56) References Cited

U.S. PATENT DOCUMENTS

| 8,993,380 | B2 | 3/2015 | Hou et al. | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2015/0262972 | A1* | 9/2015 | Katkar | H01L 25/50 257/48 |
| 2019/0148351 | A1* | 5/2019 | Chen | H01L 25/105 257/678 |
| 2020/0381391 | A1* | 12/2020 | Yu | H01L 23/5389 |

* cited by examiner

*Primary Examiner* — Eugene Lee
(74) *Attorney, Agent, or Firm* — JCIPRNET

(57) ABSTRACT

Provided is an integrated fan-out (InFO) package structure including a first die, a second die, a third die, a protective layer, and an interconnect structure. The first die has a first surface and a second surface opposite to each other. The first die has a plurality of through substrate vias (TSVs) protruding from the second surface. The second die and the third die are bonded on the first surface of the first die. The protective layer laterally surrounds protrusions of the plurality of TSVs that protrude from the second surface. The interconnect structure are disposed on the protective layer and electrically connected to the plurality of TSVs. The interconnect structure includes a polymer layer covering the protective layer.

20 Claims, 13 Drawing Sheets

INTEGRATED FAN-OUT (INFO) PACKAGE STRUCTURE AND METHOD

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
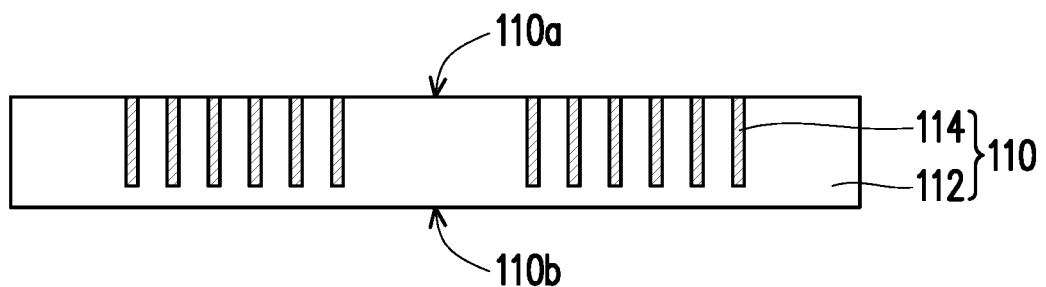
FIG. 1A to FIG. 1D are schematic cross-sectional views illustrating a process flow for fabricating a package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views illustrating a process flow for fabricating a package in accordance with some embodiments of the present disclosure. FIG. 2A to FIG. 2D are schematic top views of the structure illustrated in FIG. 1A to FIG. 1D. FIG. 3A and FIG. 3B are various cross-sectional views of a die stack structure of FIG. 1B. FIG. 4A to FIG. 4E are schematic cross-sectional views illustrating a process flow for fabricating a package in accordance with some embodiments of the present disclosure Referring to FIG. 1A and FIG. 2A, a first die 110 having a first surface 110a and a second surface 110b opposite to each other is provided. In detail, the first die 110 includes a substrate 112 and a plurality of through substrate vias (TSVs) 114. The TSVs 114 are exposed by the first surface 110a and covered by the second surface 110b. In other words, the TSVs 114 partially embedded in the substrate 112 are not exposed at the second surface 110b.

Figure 2A:
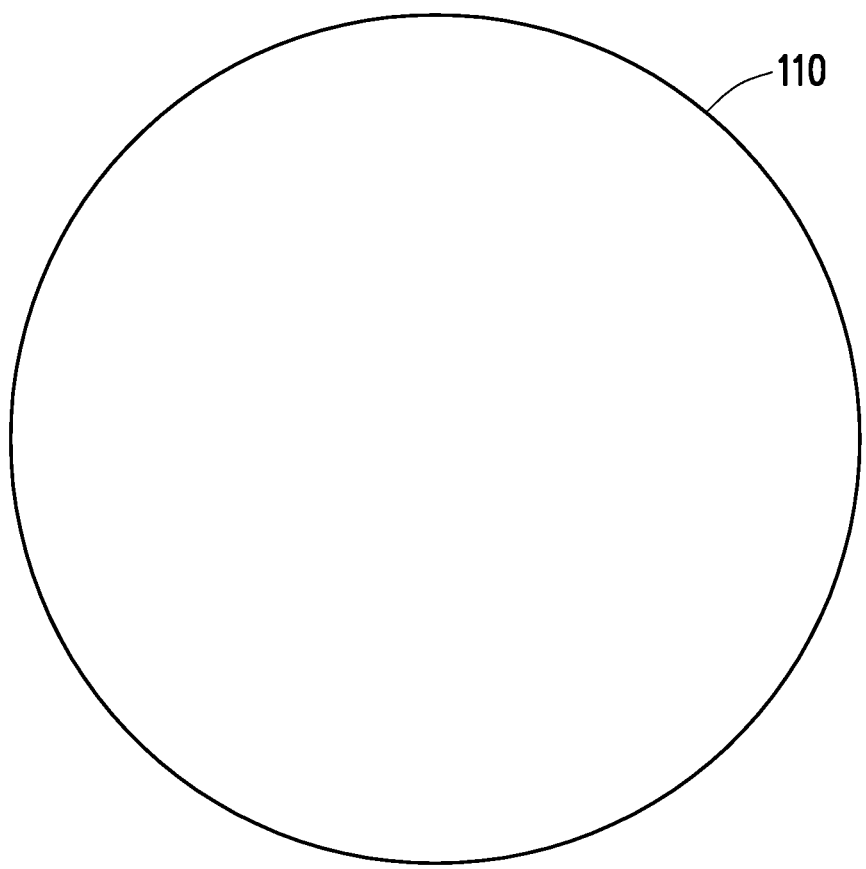
FIG. 2A to FIG. 2D are schematic top views of the structure illustrated in FIG. 1A to FIG. 1D.
Figure 3A:
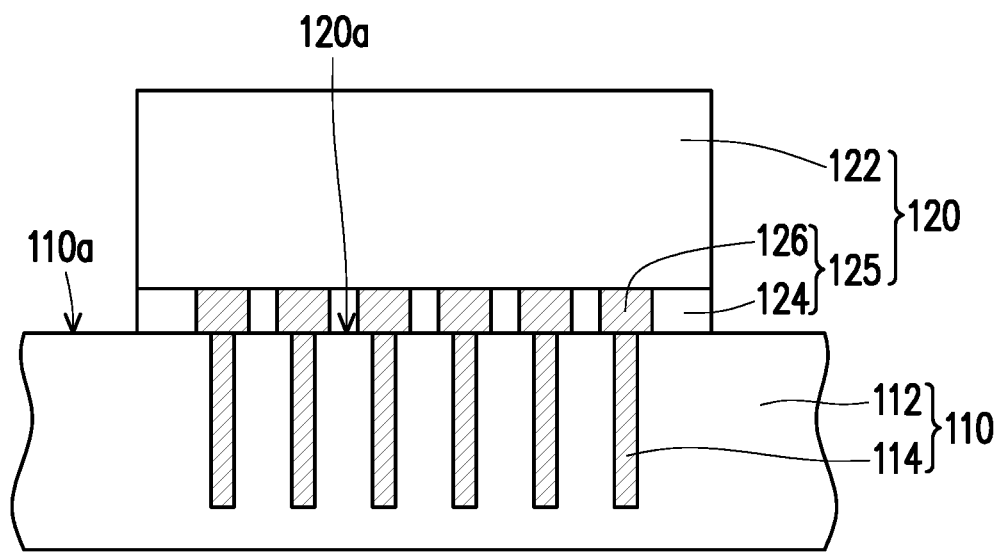
FIG. 3A and FIG. 3B are various cross-sectional views of a die stack structure of FIG. 1B.
Figure 3B:
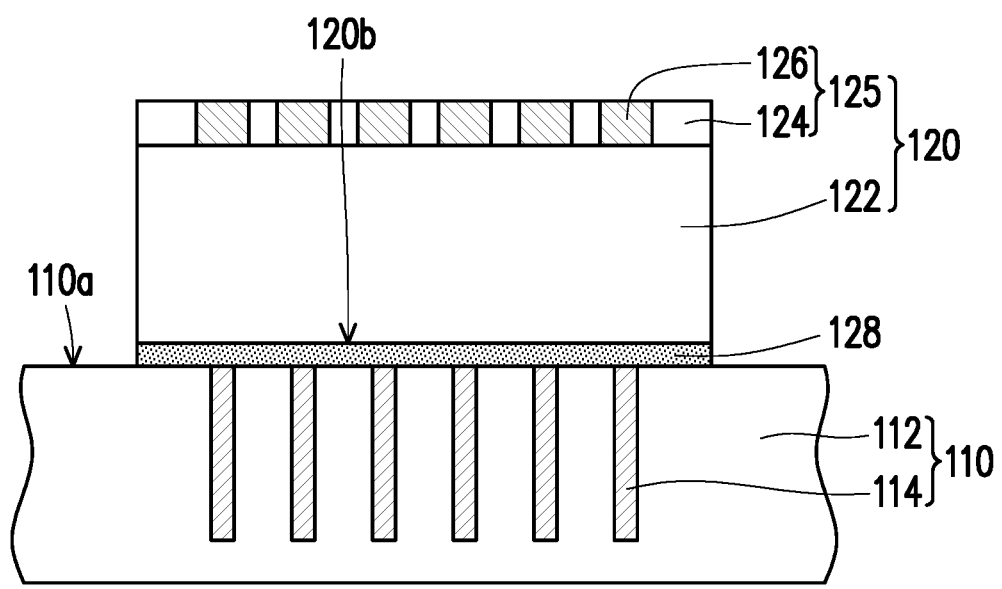

In the present embodiment, the first die 110 is a wafer, such as a silicon wafer or a silicon interposer, as shown in FIG. 2A. In some embodiments, the first die 110 may be a logic die (e.g., central processing unit, mobile application processor, ASIC, GPU, FPGA, microcontroller, etc.), a memory die (e.g., dynamic random access memory (DRAM) die, a Wide I/O die, a M-RAM die, a R-RAM die, a NAND die, a static random access memory (SRAM) die, etc.), a memory cube (e.g., HBM, HMC, etc.), a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, signal processing dies (e.g., digital signal processing (DSP) die), a front-end die (e.g., analog front-end (AFE) dies), a monolithic 3D heterogeneous chiplet stacking die, the like, or a combination thereof.

Before the intermediate step illustrated in FIG. 1A, the first die 110 may be processed according to applicable manufacturing processes to form integrated circuits in the first die 110. For example, the first die 110 includes the substrate 112, such as silicon, doped or undoped, or an active layer of a semiconductor-on-insulator (SOI) substrate. The substrate 112 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the substrate 112 and may be interconnected by interconnect structures formed by, for example, metallization patterns in one or more dielectric layers on the substrate 112 to form an integrated circuit. The interconnect structures are formed using damascene and/or dual-damascene process, in some embodiments. The TSVs 114 may penetrate through the substrate 112 to electrically connect to the interconnect structures.

Figure 1B:
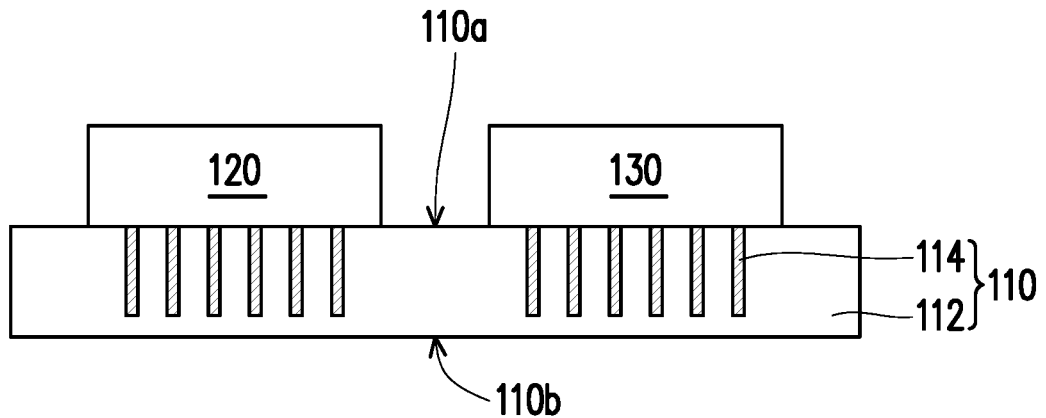
Figure 2B:
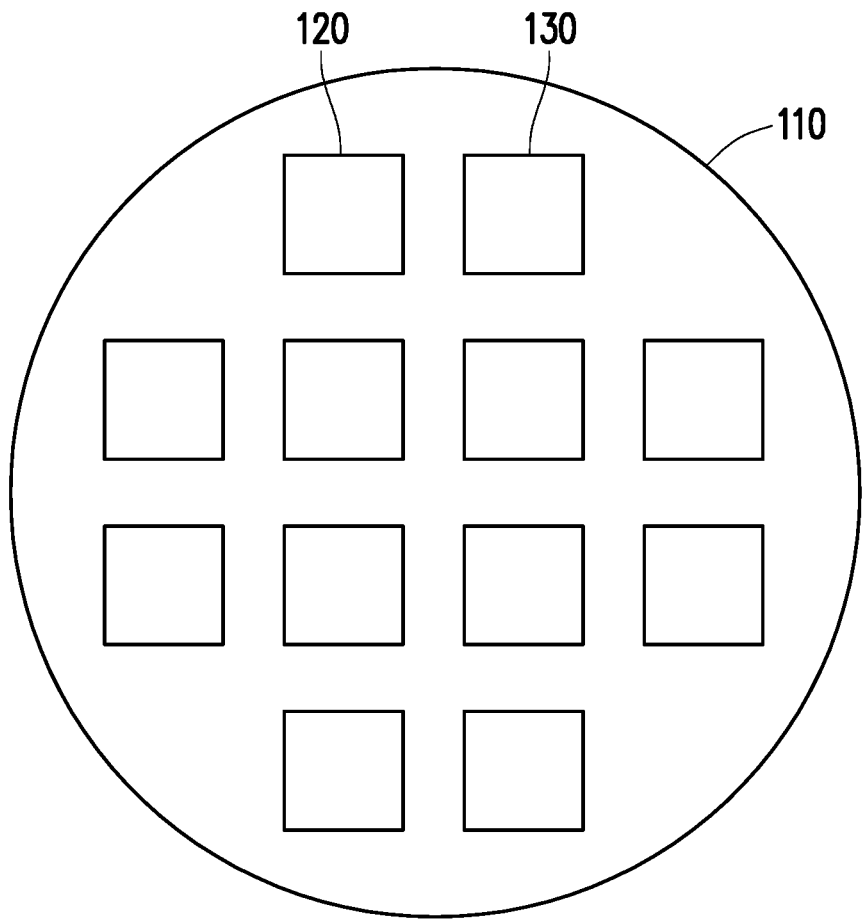
Figure 1C:
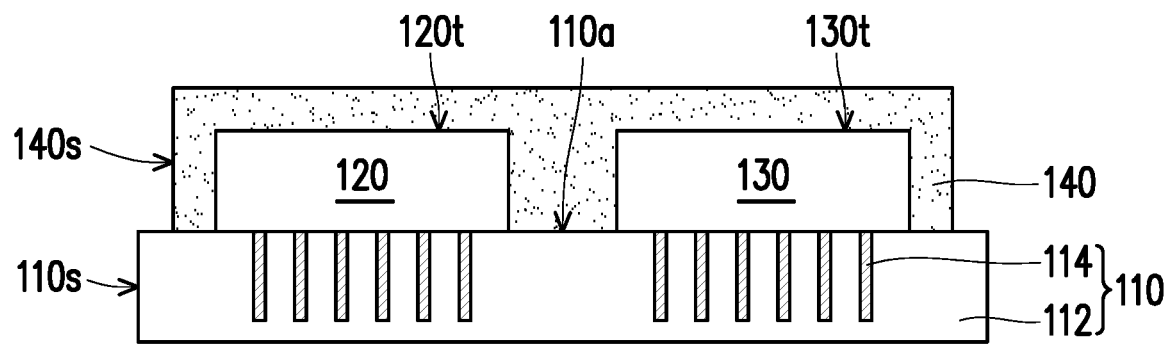

Referring to FIG. 1B and FIG. 2B, a second die 120 and a third die 130 are provided. In some embodiments, the second die 120 and the third die 130 may be a logic die (e.g., central processing unit, mobile application processor, ASIC, GPU, FPGA, microcontroller, etc.), a memory die (e.g., dynamic random access memory (DRAM) die, a Wide I/O die, a M-RAM die, a R-RAM die, a NAND die, a static random access memory (SRAM) die, etc.), a memory cube (e.g., HBM, HMC, etc.), a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, signal processing dies (e.g., digital signal processing (DSP) die), a front-end die (e.g., analog front-end (AFE) dies), a monolithic 3D heterogeneous chiplet stacking die, the like, or a combination thereof. In the present embodiment, the first die 110, the second die 120, and the third die 130 have different functions or the same function. For example, the first die 110 may be a logic die with analog IP function, the second die 120 may be another logic die with GPU function, and the third die 130 may be a memory die with wide I/O function.

As shown in FIG. 1B, the second die 120 and the third die 130 are bonded on the first surface 110a of the first die 110. In some embodiments, the area and/or the width of the second die 120 and the third die 130 is smaller than the area and/or the width of the first die 110, as shown in FIG. 2B. After bonding the second die 120 and the third die 130 onto the first die 110, a die stack structure is accomplished.

In some embodiments, the die stack structure may involve at least two configurations including a face-to-face configuration illustrated in FIG. 3A and a face-to-back configuration illustrated in FIG. 3B. FIG. 3A and FIG. 3B both illustrate a region of the second die 200 bonded onto the first die 110. Since another region of the third die 130 bonded onto the first die 110 has similar configuration, details thereof are omitted here. As shown in FIG. 3A, the second die 120 may include a substrate 122 and a bonding structure 125 on the substrate 122. The bonding structure 125 may include a bonding dielectric layer 124 and a bonding metal layer 126 embedded in the bonding dielectric layer 124. The bonding metal layer 126 is exposed by the bonding dielectric layer 124. The second die 120 is turned upside down and mounted onto the first die 110. That is, an active surface 120a of the second die 120 faces toward the first surface 110a of the first die 110, and the bonding structure 125 is disposed between the substrate 122 and the first die 110. Thereafter, the second die 120 and the first die 110 are directly bonded together to form the die stack structure. The second die 120 are electrically connected to the first die 110 via the bonding structure 125 and the TSVs 114.

In some embodiments, before the second die 120 is bonded to the first die 110, the bonding metal layer 126 is aligned with the TSVs 114. In some embodiments, the alignment of the bonding metal layer 126 and the TSVs 114 may be achieved by using an optical sensing method. After the alignment is achieved, the bonding metal layer 126 and the TSVs 114 are bonded together by a direct bonding. The bonding metal layer 126 and the TSVs 114 are directly bonded together by the application of pressure and heat. It is understood that the direct bonding involves at least two types of bonding, including metal-to-metal bonding and non-metal-to-non-metal bonding such as dielectric-to-dielectric bonding or fusion bonding. For example, as shown in FIG. 3A, a portion of the bonding metal layer 126 is bonded to the TSVs 114 by metal-to-metal bonding. On the other hand, the bonding dielectric layer 124 may be bonded to a portion of the substrate 112 at the first surface 110a by non-metal-to-non-metal bonding. In the case, the direct bonding may be referred to as a hybrid bonding.

Referring to FIG. 3B, the second die 120 has a non-active surface 120b faces toward the first surface 110a of the first die 110. Thereafter, the second die 120 and the first die 110 are bonded together via an adhesive layer 128. In some embodiments, the adhesive layer 128 may be any suitable adhesive, epoxy, die attach film (DAF), or the like.

Referring back to FIG. 1C and FIG. 2C, an encapsulant 140 is formed to encapsulate the second die 120 and the third die 130. Specifically, the formation of the encapsulant 140 is an over-molding process that includes following steps. First, an encapsulation material is formed over the first surface 110a of the first die 110 to fill in gaps between the second die 120 and the third die 130 and further extend to cover a top surface 120t of the second die 120 and a top surface 130t of the third die 130. That is, the second die 120 and the third die 130 are fully covered and not revealed by the encapsulation material. In some embodiments, the encapsulation material includes a molding compound, a molding underfill, a resin (such as an epoxy resin), or the like.

Figure 2C:
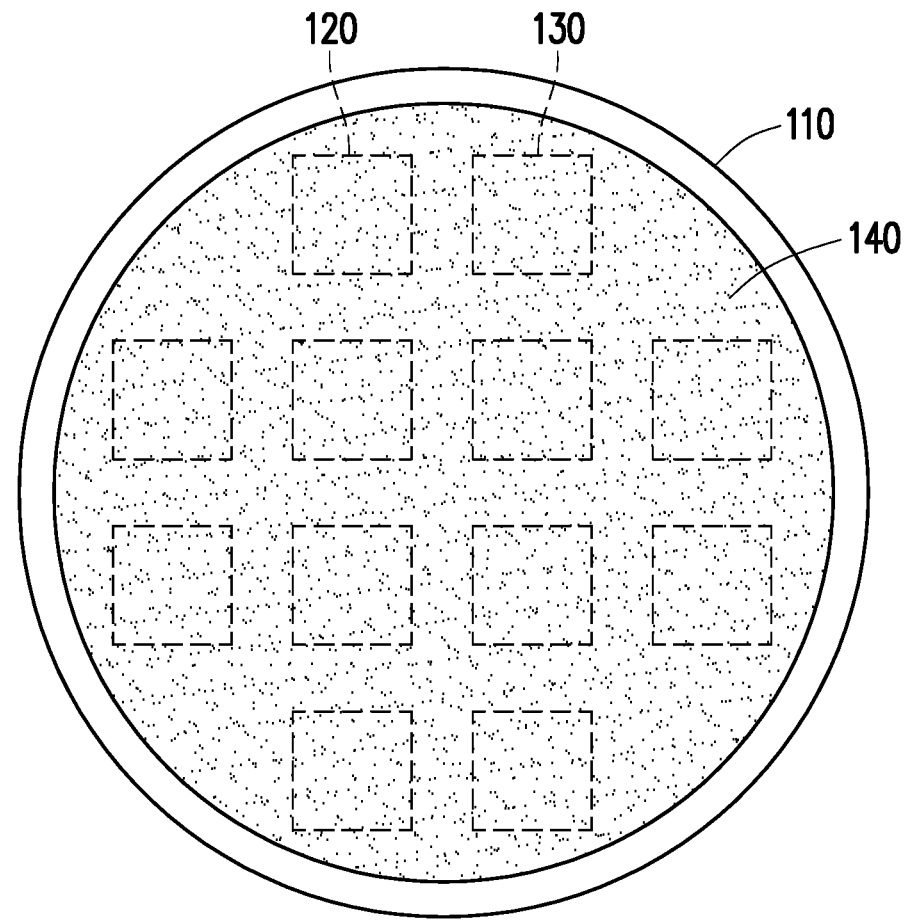

It should be noted that a sidewall 140s of the encapsulant 140 is concave from a sidewall 110s of the first die 110. That is, the area of the encapsulant 140 is less than the area of the first die 110, as shown in FIG. 2C. In some embodiments, a distance between the sidewall 140s of the encapsulant 140 and the sidewall 110s of the first die 110 is in a range of 500 μm to 1000 μm. Since the sidewall 140s of the encapsulant 140 is concave from the sidewall 110s of the first die 110, a film subsequently formed is hardly formed on the sidewall 140s of the encapsulant 140 by a conventional deposition, such as chemical vapor deposition (CVD), spin-on coating, or the like. In the case, the protection on the sidewall 140s of the encapsulant 140 is getting worse as the thickness of the to-be-formed film on the sidewall 140s decreases, thereby resulting in the peel-off defect and further effecting the yield. In the present embodiment, the issue can be solved, the detail shows as following paragraphs.

Figure 1D:
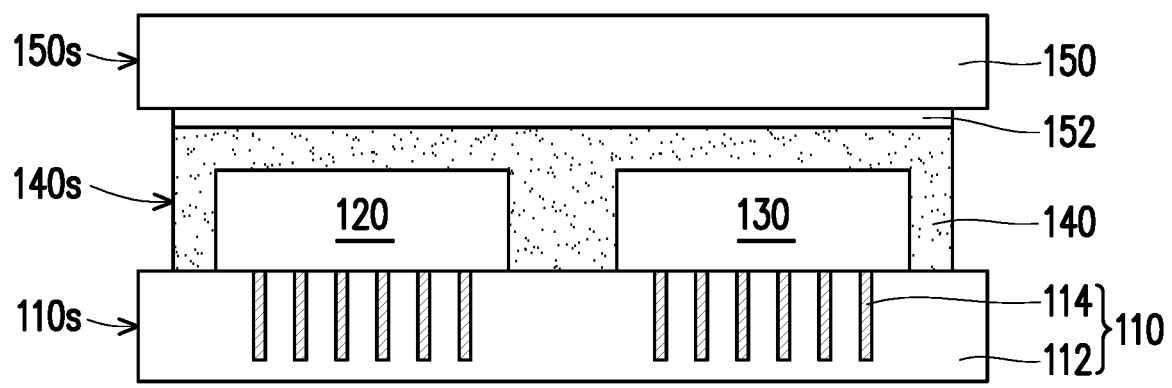
Figure 2D:
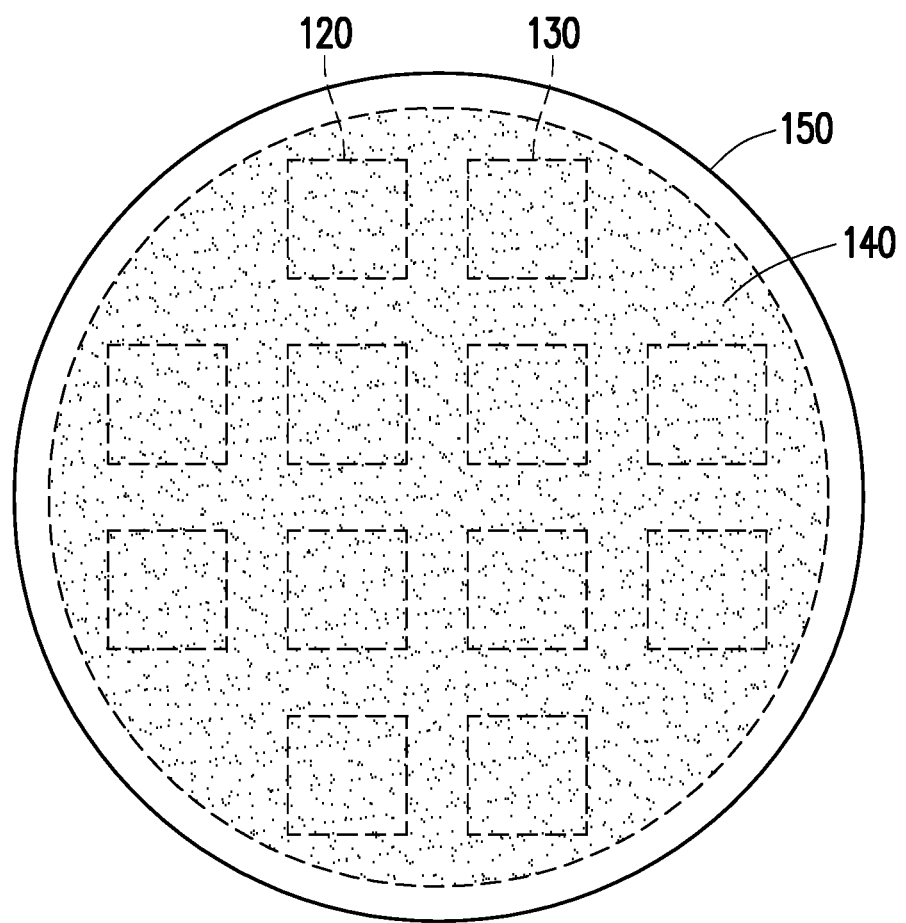

Referring to FIG. 1D and FIG. 2D, a carrier 150 is mounded onto the encapsulant 140 via an adhesive layer 152, such as die attach film (DAF). In some embodiments, the carrier 150 is a glass substrate, a silicon substrate, or any suitable carrier. The carrier 150 may have a sidewall 150s substantially equal to the sidewall 110s of the first die 110. However, the disclosure is not limited thereto. In other embodiments, the area of the carrier 150 may be greater than the area of the first die 110.

Figure 4A:
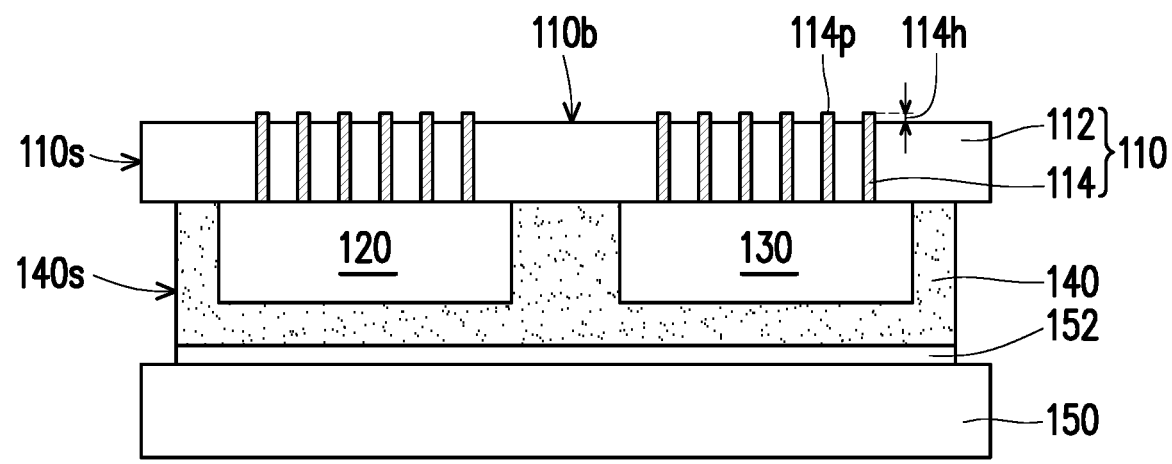
FIG. 4A to FIG. 4E are schematic cross-sectional views illustrating a process flow for fabricating a package in accordance with some embodiments of the present disclosure.

Referring to FIG. 4A, after mounting the carrier 150 onto the encapsulant 140, the structure illustrated in FIG. 1D is turned upside down, so that the second surface 110b of the first die 110 faces upside. A grinding process is then performed on the second surface 110b of the first die 110 to reveal the TSVs 114 at the second surface 110b of the first die 110. In other words, a portion of the substrate 112 is removed and further thinned until exposing the TSVs 114. In the case, as shown in FIG. 4A, the TSVs 114 have protrusions 114p protruding from the second surface 110b of the first die 110. In some embodiments, a height 114h of the protrusions 114p is in a range of 200 nm to 4000 nm. The grinding process may include a chemical mechanical polishing (CMP) process, a mechanical grinding process, or the like.

Figure 4B:
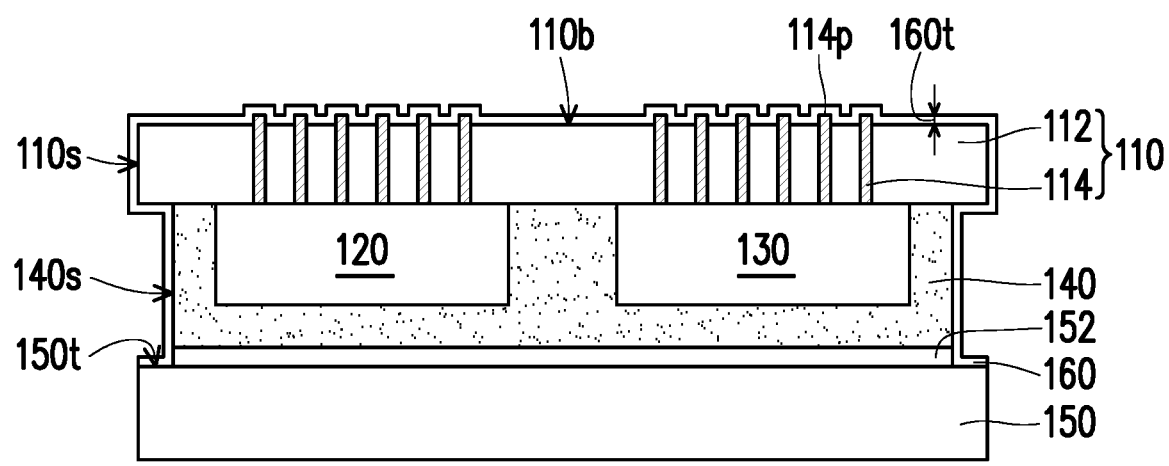

Referring to FIG. 4B, an atomic layer deposition (ALD) process is performed to form a protective layer 160 on the sidewall 114s of the encapsulant 114, the sidewall 110s and the second surface 110b of the first die 110, and the protrusions 114p of the TSVs 114. In addition, the protective layer 160 further extends to cover a portion of the top surface 150t of the carrier 150. In some embodiments, the protective layer 160 includes an inorganic dielectric material, and the inorganic dielectric material includes SiN, SiO, AlO, AlN, or a combination thereof. The protective layer 160 may have a thickness 160t in a range of 50 nm to 2000 nm. It should be noted that since the ALD protective layer 160 has excellent uniformity and step coverage, the ALD protective layer 160 is able to fully cover the sidewall 114s of the encapsulant 114, thereby improving the protection of the recessed sidewall 114s. On the other hand, the ALD protective layer 160 has a dense film property, thus the ALD protective layer 160 is able to block the etchant or chemical subsequently applied from damaging the encapsulant 114, and further protect the second die 120 and third die 130 within the encapsulant 114.

Figure 4C:
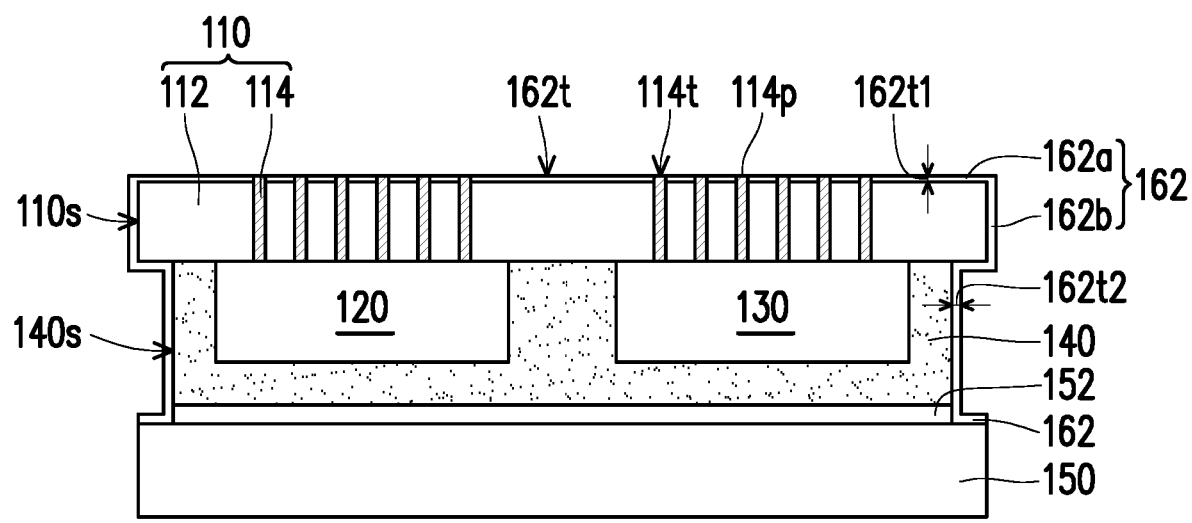

Referring to FIG. 4C, a planarization process (e.g., CMP process) is performed to remove a portion of the protective layer 160. In the case, the top surfaces 114t of the protrusions 114p of the TSVs 114 are coplanar with a top surface 162t of a planarized protective layer 162. In some embodiments, the protective layer 162 may have a first portion 162a and a second portion 162b. Specifically, the first portion 162a laterally surrounds the protrusions 114p of the TSVs 114 and has a first thickness 162t1. The second portion 162b covers the sidewall 140s of the encapsulant 140 and the sidewall 110s of the first die 110, and has a second thickness 162t2. Since the first portion 162a is suffered the planarization process while the second portion 162b is not, the second thickness 162t2 is greater than the first thickness 162t1.

Figure 4D:
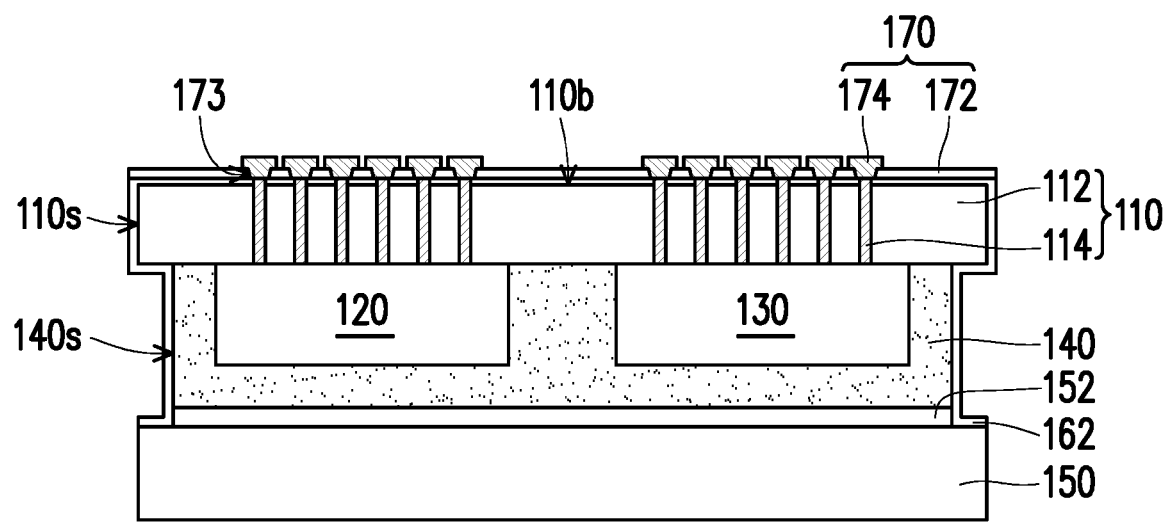

Referring to FIG. 4D, a polymer layer 172 is formed on the top surfaces 114t of the protrusions 114p and the first portion 162a of the protective layer 162. In some embodiments, the polymer layer 172 include polyimide (PI), epoxy resin, acrylic resin, phenol resin, benzocyclobutene (BCB), polybenzoxazole (PBO), or any other suitable polymer-based dielectric material. The polymer layer 172 may be formed by a suitable forming method, such as spin-on coating, CVD, or the like. In some alternative embodiments, the polymer layer 172 may include an organic dielectric material, and the polymer layer 172 and the protective layer 162 have different materials. For example, the protective layer 162 is an ALD SiN layer, and the polymer layer 172 is a polyimide layer. The ALD SiN layer may have a density greater than a density of the polyimide layer. As such, the ALD SiN layer has a thinner thickness and a better protection for the recessed sidewall 114s of the encapsulant 114.

After forming the polymer layer 172, the polymer layer 172 is patterned when the sidewall 114s of the encapsulant 114 and the sidewall 110s of the first die 110 are covered with the protective layer 162, so as to form a plurality of openings 173 in the polymer layer 172. The openings 173 expose the protrusions 114p of the TSVs 114. As shown in FIG. 4D, a conductive feature 174 is then formed in the openings 173 to electrically connect the TSVs 114. In some embodiments, the conductive feature 174 may include a seed layer and a conductive layer thereon. The seed layer may be a titanium/copper composited layer, and may be formed by CVD or PVD. The conductive layer may include metal, such as copper, aluminum, nickel, titanium, a combination thereof or the like, and may be formed by an electroplating process. In the present embodiment, the conductive feature 174 includes a plurality of metal pillars (e.g., Cu pillars) respectively in the openings 173 to be in contact with the TSVs 114. In some alternative embodiments, the polymer layer 172 and the conductive feature 174 constitute an interconnect structure 170 on the second surface 110b of the first die 110. The conductive feature 174 may be a circuit layer having a plurality of traces and vias stacked alternately. Although only single one polymer layer 172 and single one conductive feature 174 are illustrated in FIG. 4D, the disclosure is not limited thereto. In other embodiments, the number of the polymer layer or the conductive feature is adjusted by the need.

It should be noted that, the protective layer 162 is able to protect the recessed sidewall 114s of the encapsulant 114 from damaging by the etchant or chemical during the patterning the polymer layer 172. In the case, no peel-off defect is present, and no additional rework process is needed to remove the peel-off defect due to full coverage protection, thereby improving the throughput and the reliability. In addition, since the recessed sidewall 114s of the encapsulant 114 is fully covered by the protective layer 162, it can enlarge the new material integration window without worrying about chemical attack issue. Moreover, the present embodiment may enable a fine-pitch redistribution layer (RDL) structure due to the allowance of thinner polymer layer or thinner seed layer.

Figure 4E:
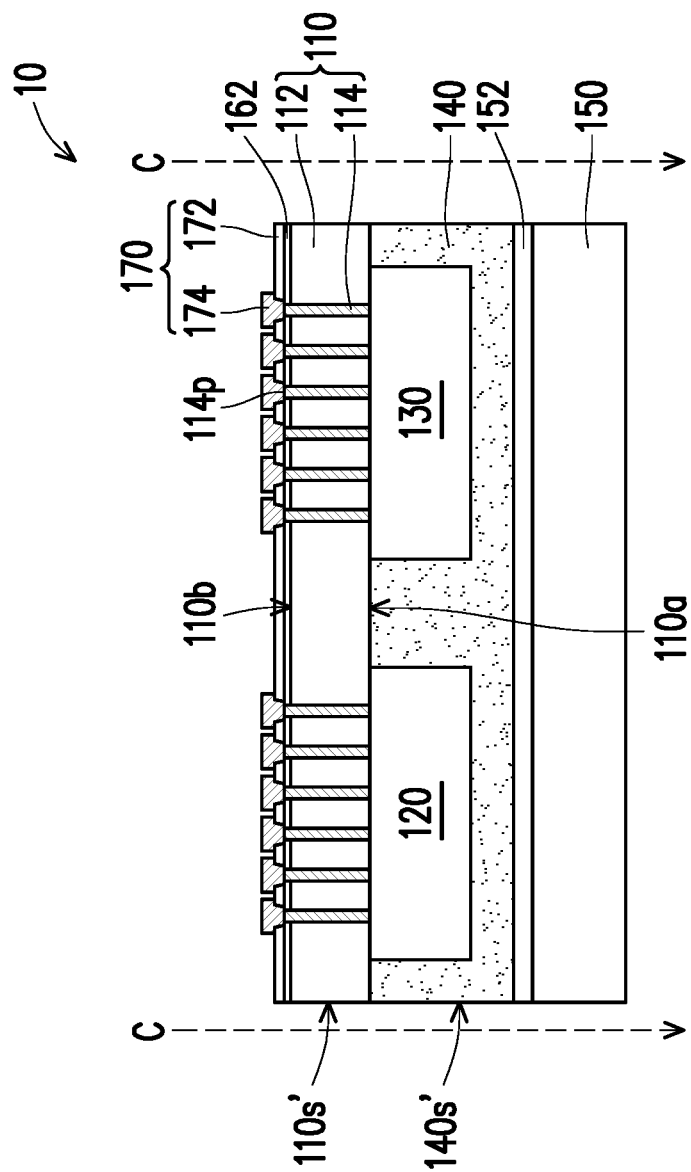

Referring to FIG. 4D and FIG. 4E, a singulation process is performed along the lines C, so as to form a plurality of singulated packages 10. As shown in FIG. 4E, the packages 10 includes the first die 110, the second die 120, the third die 130, the encapsulant 140, the protective layer 162, and the interconnect structure 170. The second die 120 and the third die 130 are bonded onto the first surface 110a of the first die 110. The encapsulant 140 encapsulates the second die 120 and the third die 130. A cut sidewall 140s' of the encapsulant 140 is aligned with a cut sidewall 110s' of the first die 110. The interconnect structure 170 is disposed on the second surface 110b of the first die 110 and is electrically connected to the TSVs 114 in the first die 110. The protective layer 162 is sandwiched between the second surface 110b of the first die 110 and the interconnect structure 170. The protective layer 162 laterally encapsulates the protrusions 114p of the TSVs 114 protruding from the second surface 110b of the first die 110.

FIG. 5A to FIG. 5E are schematic cross-sectional views illustrating a process flow for fabricating an integrated fan-out (InFO) package structure in accordance with some embodiments of the present disclosure.

Figure 5A:
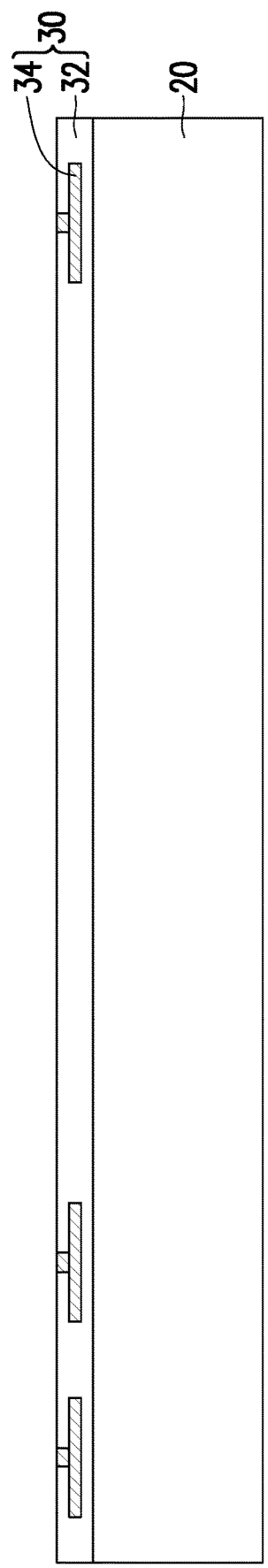
FIG. 5A to FIG. 5E are schematic cross-sectional views illustrating a process flow for fabricating an integrated fan-out (InFO) package structure in accordance with some embodiments of the present disclosure.

Referring to FIG. 5A, a carrier 20 is provided. In some embodiments, the carrier 20 is a glass substrate, a silicon substrate, or any suitable carrier. A redistribution layer (RDL) structure 30 is formed on the carrier 20. In detail, the RDL structure 30 may include a polymer layer 32 and a conductive feature 34 embedded in the polymer layer 32. The polymer layer 32 may be a single layer or a multilayer structure, for example. In some embodiments, the polymer layer 32 include polyimide (PI), epoxy resin, acrylic resin, phenol resin, benzocyclobutene (BCB), polybenzoxazole (PBO), or any other suitable polymer-based dielectric material. The polymer layer 32 may be formed by a suitable forming method, such as spin-on coating, CVD, or the like. In some embodiments, the conductive feature 34 includes a plurality of traces and vias (not shown) stacked alternately. The conductive feature 34 is formed by following steps including forming a seed layer (not shown) on the polymer layer 32 by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the conductive feature 34 may include the conductive material and underlying seed layer. In some embodiments, the conductive feature 34 may include metal, such as copper, aluminum, nickel, titanium, a combination thereof or the like.

Although only one RDL structure 30 is illustrated in FIG. 5A, the embodiments of the present invention are not limited thereto. In some embodiments, one or more RDL structures are formed on the carrier 20. That is, one or more polymer layers and conductive features formed in the one or more polymer layers are included in the RDL structure 20. However, the layout or the arrangement of the RDL structures is not limited by the embodiments described herein.

Figure 5B:
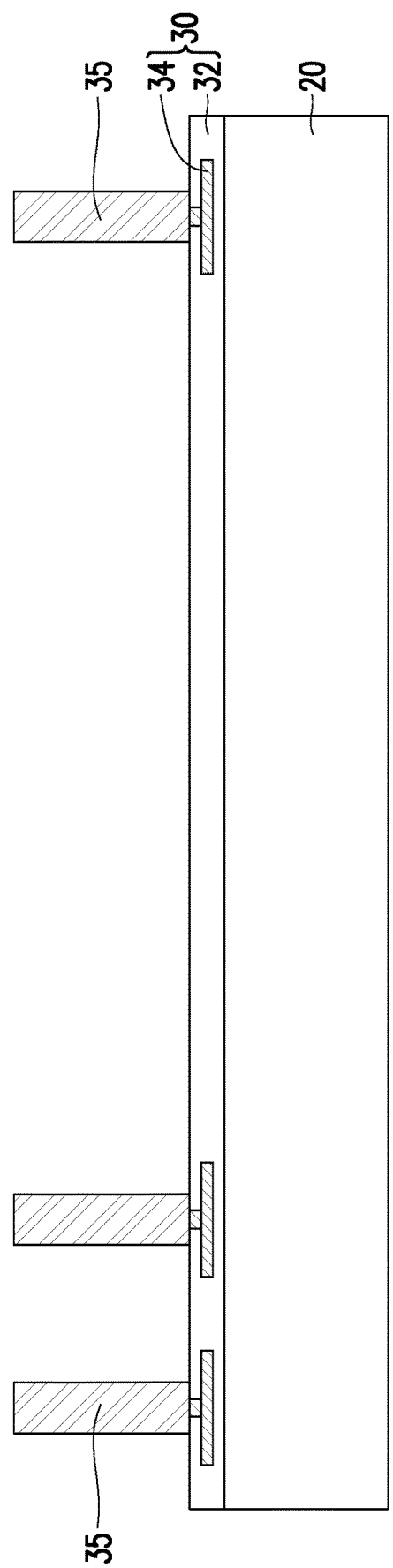

Referring to FIG. 5B, after the RDL structure 30 is formed, a plurality of through insulator vias (TIVs) 35 are formed on and electrically connected to the RDL structure 30. In some embodiments, the TIVs 35 are formed by photolithography, plating, and photoresist stripping process. For example, the TIVs 35 include copper posts. The TIVs 35 may be formed by following steps including forming a seed layer (not shown) on the RDL structure 30 by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the TIVs 35 may include the conductive material and underlying seed layer. In some alternative embodiments, the TIVs 35 are obtained by the manufacturer may be mounted on the RDL structure 30.

Figure 5C:
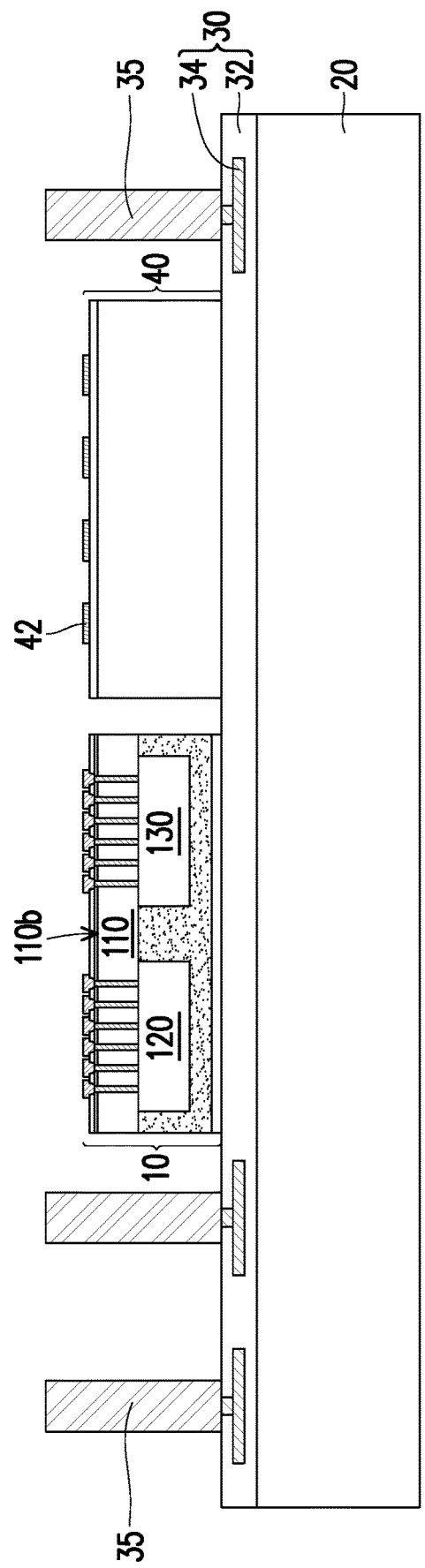

Referring to FIG. 5C, after the TIVs 35 are formed, the package 10 (FIG. 4E) is de-mounted from the carrier 150. Next, the package 10 and a fourth die 40 are picked and placed on the RDL structure 30. The package 10 and the fourth die 40 are disposed in parallel, and surrounded by the TIVs 35. In the case, the package 10 may have the second surface 110b facing upside, and the fourth die 40 may include a plurality of contacts 42 facing upside. In some embodiments, the fourth die 40 may be a logic die (e.g., central processing unit, mobile application processor, ASIC, GPU, FPGA, microcontroller, etc.), a memory die (e.g., dynamic random access memory (DRAM) die, a Wide I/O die, a M-RAM die, a R-RAM die, a NAND die, a static random access memory (SRAM) die, etc.), a memory cube (e.g., HBM, HMC, etc.), a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, signal processing dies (e.g., digital signal processing (DSP) die), a front-end die (e.g., analog front-end (AFE) dies), a monolithic 3D heterogeneous chiplet stacking die, the like, or a combination thereof. The first, second, third, and fourth dies 110, 120, 130, and 40 may different functions or the same function. In some embodiments, the height of the package 10 is substantially the same as the height of the fourth die 40, and is lower than the height of the TIVs 35.

Figure 5D:
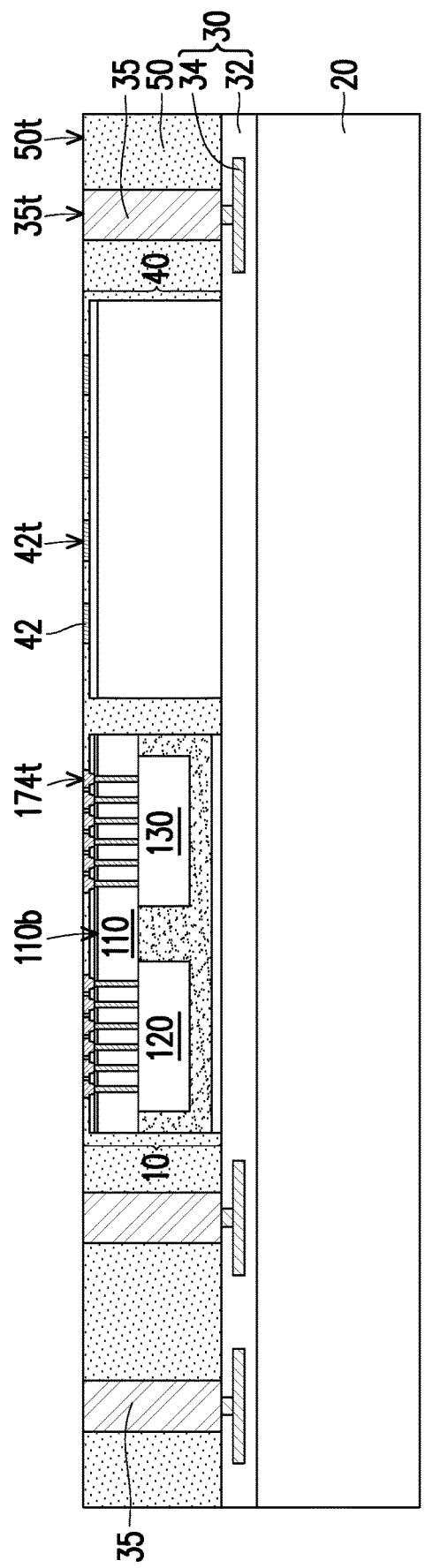

Referring to FIG. 5D, an encapsulant 50 is formed to laterally encapsulate the package 10, the fourth die 40, and the TIVs 35. In some embodiments, the encapsulant 50 includes a molding compound, a molding underfill, a resin (such as an epoxy resin), or a combination thereof, or the like. The encapsulant 50 may be formed by a sequence of an over-molding process and a planarizing process. For example, an encapsulation material (not shown) is formed over the RDL structure 30 to fill in the gaps between the package 10, the fourth die 40, and the TIVs 35 and encapsulate the package 10, the fourth die 40, and the TIVs 35. In addition, the encapsulation material further covers the top surfaces of the package 10, fourth die 40, and TIVs 35. The planarizing process is performed on the encapsulation material until the top surface 174t of the conductive feature 174, the top surfaces 42t of the contacts 42, and the top surfaces 35t of the TIVs 35 are exposed. In the case, the top surface 174t of the conductive feature 174, the top surfaces 42t of the contacts 42, the top surfaces 35t of the TIVs 35, and a top surface 50t of the encapsulant 50 are coplanar after performing the planarizing process. In some embodiments, the planarizing process includes a mechanical grinding process and/or a chemical mechanical polishing (CMP) process.

Figure 5E:
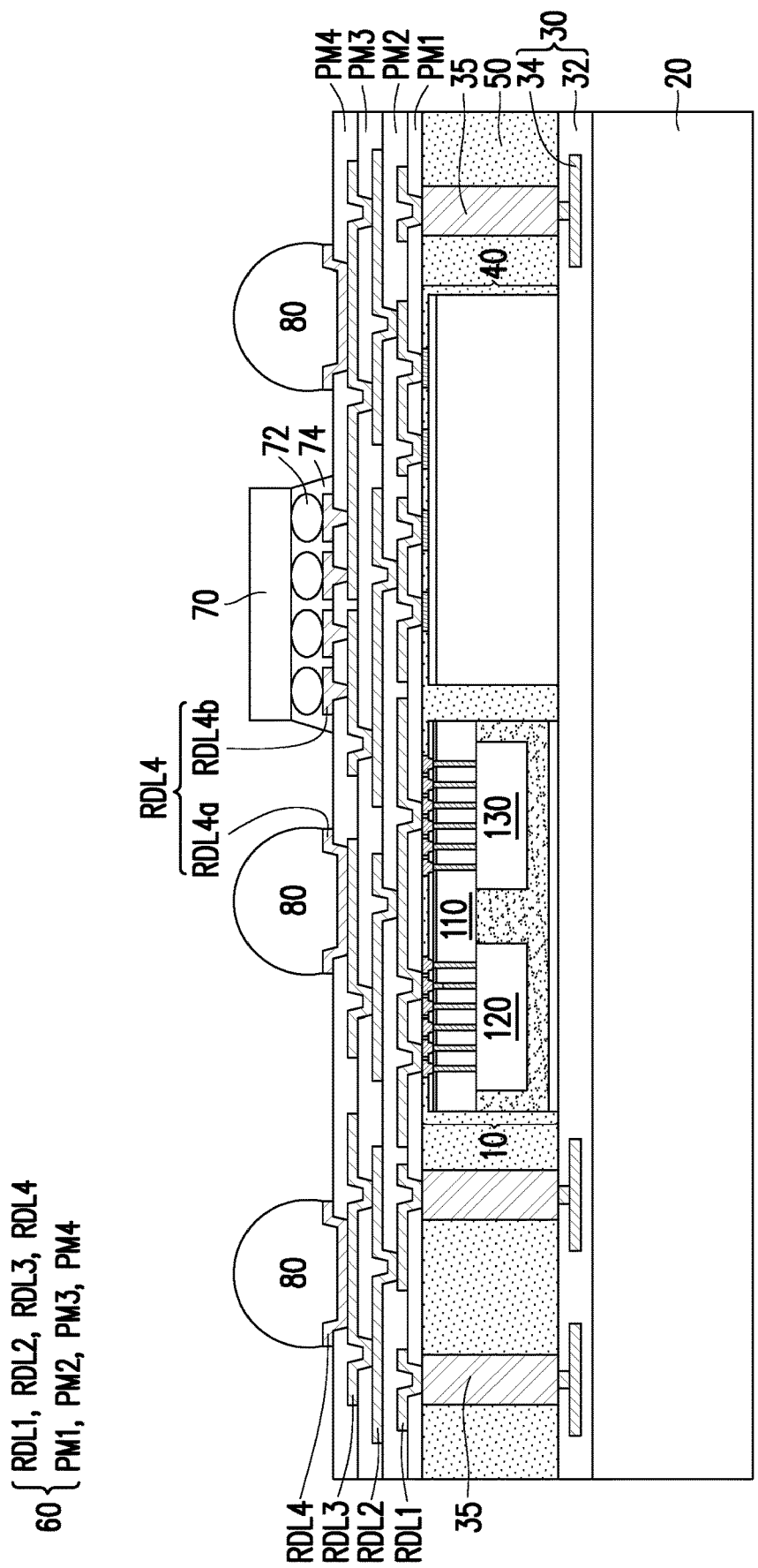

Referring to FIG. 5E, a RDL structure 60 is formed on and electrically connected to the package 10, the fourth die 40, and the TIVs 35. In some embodiments, the RDL structure 60 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In detail, the redistribution layer RDL1 penetrates through the polymer layer PM1 and is electrically connected to the conductive feature 174 of the package 10, the contacts 42 of the fourth die 40, and the TIVs 35. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, aluminum, nickel, titanium, a combination thereof or the like, and are formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL4 respectively includes a plurality of vias and a plurality of traces connected to each other. The vias connects the traces, and the traces are respectively located on the polymer layers PM1, PM2, PM3 and PM4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be micro bump for connecting to an integrated passive device (IPD) 70 formed in the subsequent process.

Thereafter, a plurality of connectors 80 are formed over and electrically connected to the redistribution layer RDL4a of the RDL structure 60. In some embodiments, the connectors 80 are made of a conductive material with low resistivity, such as Sn, Pb, Ag, Cu, Ni, Bi or an alloy thereof, and are formed by a suitable process such as evaporation, plating, ball drop, or screen printing. The IPD 70 is optionally formed over and electrically connected to the redistribution layer RDL4b of the RDL structure 60 through the solder bumps 72. The IPD 70 may be a capacitor, a resistor, an inductor or the like, or a combination thereof. The number of the IPD 70 is not limited to that is shown in FIG. 5E, but may be adjusted according to the design of the product. An underfill layer 74 is formed between the IPD 70 and the polymer layer PM4, and surrounds and covers the exposed RDL4b, the solder bumps 72 and the bottom surface of the IPD 70. After forming the connectors 80 and the IPD 70, an integrated fan-out (InFO) package structure P1 is accomplished. In some embodiments, the InFO package structure P1 is de-bonded from the carrier 20 and is further bonded onto a circuit substrate by the connectors 80, so as to form an integrated fan-out-on-Substrate (InFO-on-Substrate) structure.

According to some embodiments, an integrated fan-out (InFO) package structure including a first die, a second die, a third die, a protective layer, and an interconnect structure is provided. The first die has a first surface and a second surface opposite to each other. The first die has a plurality of through substrate vias (TSVs) protruding from the second surface. The second die and the third die are bonded on the first surface of the first die. The protective layer laterally surrounds protrusions of the plurality of TSVs that protrude from the second surface. The interconnect structure are disposed on the protective layer and electrically connected to the plurality of TSVs. The interconnect structure includes a polymer layer covering the protective layer.

According to some embodiments, a method is provided to include: providing a first die having a first surface and a second surface opposite to each other, wherein the first die has a plurality of through substrate vias (TSVs); bonding a second die and a third die on the first surface of the first die; forming a first encapsulant to encapsulating the second and third dies, wherein the first encapsulant has a sidewall concave from a sidewall of the first die; grinding the first die, so that protrusions of the plurality of TSVs protrude from the second surface of the first die; performing an atomic layer deposition (ALD) process to form a protective layer on the sidewall of the first encapsulant, the sidewall and the second surface of the first die, and the protrusions of the plurality of TSVs; and performing a planarization process, so that top surfaces of the protrusions of the plurality of TSVs are coplanar with a top surface of the protective layer.

According to some embodiments, a method is provided to include: forming a package on a carrier; performing an atomic layer deposition (ALD) process to form a protective layer on a top surface and a sidewall of the package; performing a planarization process to expose a plurality of through substrate vias (TSVs) of the package at the top surface of the package; forming a polymer layer on the plurality of TSVs and the protective layer; patterning the polymer layer when the sidewall of the package is covered with the protective layer, so as to form a plurality of openings in the polymer layer; and forming a conductive feature in the plurality of openings to electrically connect the plurality of TSVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a first die having a first surface and a second surface opposite to each other, wherein the first die has a plurality of through substrate vias (TSVs);
bonding a second die and a third die on the first surface of the first die;
forming a first encapsulant to encapsulating the second and third dies, wherein the first encapsulant has a sidewall concave from a sidewall of the first die;
grinding the first die, so that protrusions of the plurality of TSVs protrude from the second surface of the first die;
performing an atomic layer deposition (ALD) process to form a protective layer on the sidewall of the first encapsulant, the sidewall and the second surface of the first die, and the protrusions of the plurality of TSVs; and
performing a planarization process, so that top surfaces of the protrusions of the plurality of TSVs are coplanar with a top surface of the protective layer.

2. The method of claim 1, wherein after performing the planarization process, the protective layer comprises:
a first portion, laterally surrounding the protrusions of the plurality of TSVs and having a first thickness; and
a second portion, covering the sidewalls of the first encapsulant and first die, and having a second thickness, wherein the second thickness is greater than the first thickness.

3. The method of claim 1, further comprising:
forming a polymer layer on the top surfaces of the protrusions and the protective layer;
patterning the polymer layer when the sidewall of the first encapsulant is covered with the protective layer, so as to form a plurality of openings in the polymer layer; and
forming a conductive feature in the plurality of openings to electrically connect the plurality of TSVs.

4. The method of claim 3, wherein the protective layer and the polymer layer have different materials, and the protective layer has a density greater than a density of the polymer layer.

5. The method of claim 1, wherein the protective layer comprises an inorganic dielectric material, and the inorganic dielectric material comprises SiN, SiO, AlO, AlN, or a combination thereof.

6. The method of claim 1, wherein the second and third dies have active surfaces toward the first surface of the first die, and the second and third dies are bonded to the first die by a direct bonding.

7. The method of claim 1, wherein the second and third dies have non-active surfaces toward the first surface of the first die, and the second and third dies are bonded to the first die by an adhesive layer.

8. A method, comprising:
forming a package on a carrier;
performing an atomic layer deposition (ALD) process to form a protective layer on a top surface and a sidewall of the package;
performing a planarization process to expose a plurality of through substrate vias (TSVs) of the package at the top surface of the package, wherein the protective layer laterally surrounds and directly contacts protrusions of the plurality of TSVs after performing the planarization process;
forming a polymer layer on the plurality of TSVs and the protective layer;
patterning the polymer layer when the sidewall of the package is covered with the protective layer, so as to form a plurality of openings in the polymer layer; and
forming a conductive feature in the plurality of openings to electrically connect the plurality of TSVs.

9. The method of claim 8, wherein the package comprises:
a first die, having a first surface and a second surface opposite to each other, wherein the plurality of TSVs protruding from the second surface;
a second die and a third die, bonding on the first surface of the first die; and
a first encapsulant, encapsulating the second and third dies, wherein a sidewall of the first encapsulant is concave from a sidewall of the first die.

10. The method of claim 9, further comprising:
singulating the package, so that the sidewall of the first encapsulant is aligned with the sidewall of the first die;
placing a singulated package and a fourth die in parallel on a first redistribution layer (RDL) structure;
forming a second encapsulant to laterally encapsulating the singulated package and the fourth die; and
forming a second RDL structure on the singulated package and the fourth die, so that the singulated package, the fourth die, and the second encapsulant are sandwiched between the first and second RDL structures.

11. The method of claim 10, further comprising:
forming a plurality of through insulator vias (TIVs) to penetrate through the second encapsulant and electrically connect the first and second RDL structures; and
forming a plurality of connectors on the second RDL structure.

12. The method of claim 8, wherein the protective layer comprises an inorganic dielectric material, and the inorganic dielectric material comprises SiN, SiO, AlO, AlN, or a combination thereof.

13. A method, comprising:
providing a first die having a first surface and a second surface opposite to each other, wherein the first die has a plurality of through substrate vias (TSVs);
bonding a second die and a third die on the first surface of the first die;
forming a first encapsulant to encapsulating the second and third dies;
grinding the first die, so that protrusions of the plurality of TSVs protrude from the second surface of the first die;
performing an atomic layer deposition (ALD) process to form a protective layer overlying the sidewall of the first encapsulant, the sidewall and the second surface of the first die, and the protrusions of the plurality of TSVs; and
performing a planarization process to remove a portion of the protective layer, so that top surfaces of the protrusions of the plurality of TSVs are exposed, wherein a first portion of the protective layer laterally surrounds the protrusions of the plurality of TSVs, and a second portion of the protective layer covers the sidewalls of the first encapsulant and first die.

14. The method of claim 13, wherein the top surfaces of the protrusions of the plurality of TSVs are coplanar with a top surface of the first portion of the protective layer.

15. The method of claim 13, wherein the first portion of the protective layer has a first thickness, the second portion of the protective layer has a second thickness, and the second thickness is greater than the first thickness.

16. The method of claim 13, further comprising:
forming a polymer layer on the top surfaces of the protrusions and the protective layer;
patterning the polymer layer when the sidewall of the first encapsulant is covered with the protective layer, so as to form a plurality of openings in the polymer layer; and
forming a conductive feature in the plurality of openings to electrically connect the plurality of TSVs.

17. The method of claim 16, wherein the protective layer and the polymer layer have different materials, and the protective layer has a density greater than a density of the polymer layer.

18. The method of claim 13, wherein the protective layer comprises an inorganic dielectric material, and the inorganic dielectric material comprises SiN, SiO, AlO, MN, or a combination thereof.

19. The method of claim 13, wherein the second and third dies have active surfaces toward the first surface of the first die, and the second and third dies are bonded to the first die by a direct bonding.

20. The method of claim 13, wherein the second and third dies have non-active surfaces toward the first surface of the first die, and the second and third dies are bonded to the first die by an adhesive layer.

* * * * *